United States Patent [19]

Halder et al.

[11] Patent Number: 5,072,173

[45] Date of Patent: Dec. 10, 1991

[54] PHASE DETECTOR FOR MARK/SPACE MODULATED SIGNALS

[75] Inventors: Mathis Halder, Baar; Theo Frutiger, Steinhausen, both of Switzerland

[73] Assignee: Landis & Gyr Betriebs AG, Zug, Switzerland

[21] Appl. No.: 457,262

[22] Filed: Dec. 27, 1989

[30] Foreign Application Priority Data

Mar. 31, 1989 [CH] Switzerland ............... 1186/89

[51] Int. Cl.$^5$ ..................................... G01R 21/127
[52] U.S. Cl. ............................. 324/141; 307/511; 324/83 R
[58] Field of Search ........... 324/141, 142, 83 R, 324/83 Q, 107; 307/512, 511; 328/155; 331/27

[56] References Cited

U.S. PATENT DOCUMENTS

| | | | |
|---|---|---|---|
| 3,602,843 | 8/1971 | De Vries. | |
| 4,217,545 | 8/1980 | Kusui et al. | 324/107 |
| 4,315,212 | 2/1982 | Gamoh | 324/142 |
| 4,594,547 | 6/1986 | Halder. | |
| 4,859,937 | 8/1989 | Milkovic | 324/142 |

FOREIGN PATENT DOCUMENTS 472677 6/1969 Switzerland.

*Primary Examiner*—Ernest F. Karlsen

*Attorney, Agent, or Firm*—Marmorek, Guttman & Rubenstein

[57] ABSTRACT

A phase detector includes a pulse amplitude modulator and an integrator. The pulse amplitude modulator comprises a change-over switch the control input of which is fed by pulses which are subjected to mark/space modulation by means of a phase-shifted signal while the amplitude input of the pulse amplitude modulator is fed by a non-phase-shifted signal. The integrator includes an integrating amplifier, the output of which is connected by means of a capacitor to an inverting input of the integrating amplifier while the non-inverting input of the integrating amplifier is connected to ground by way of a further capacitor. The inverting and non-inverting inputs of the integrating amplifier are connected by way of respective resistors to two inputs of the integrator which in turn are connected to ground by way of respective resistors on the one hand and which on the other hand are connected by way of respective switch contacts of the change-over switch to the amplitude input of the pulse amplitude modulator. The phase detector requires only a single amplifier and may be used in phase-lock loops of static electricity meters which operate using the mark/space amplitude modulation method and which serve for the measurement of reactive energy, and which therefore require a 90° phase shift provided by the phase-lock loop.

8 Claims, 4 Drawing Sheets

PHASE DETECTOR FOR MARK/SPACE MODULATED SIGNALS

BACKGROUND OF THE INVENTION

1. Field of the Invention

This invention relates to phase detectors for mark/space modulated signals.

2. Description of the Prior Art

Such phase detectors are advantageously used in phase-lock loops of static single-phase or multi-phase electricity meters which operate in accordance with the mark/space modulation method and which serve for the measurement of reactive energy and therefore, as is known, include a 90° phase shifter. The phase-lock loop regulates the phase of its output signal $u_\phi$ in such a way that the difference $\phi$ between that phase and the phase of its input signal $u_o$ is equal to 90° so that the phase-lock loop represents an active 90° phase shifter.

The construction and mode of operation of an electricity meter which operates on the basis of the mark/space amplitude modulation method is known, for example, from U.S. Pat. No. 3,602,843.

A 90° phase-lock loop which comprises digital components and which is used in an electricity meter for reactive energy, and the mode of operation thereof, are known from U.S. Pat. No. 4,594,547. The digital components referred to therein may be at least partially replaced by analog components, thus in particular a delay member which operates as a phase shifter can be replaced by an analog-type phase shifter as shown in FIG. 8 of the accompanying drawings, and an accumulator which operates as an integrator can be replaced by an analog integrator. The electricity meter for reactive energy is then of the structure shown in FIG. 1 of the accompanying drawings.

SUMMARY OF THE INVENTION

It is an object of the present invention to provide very simple phase detector circuits for mark/space modulated signals, which require a low level of expenditure in respect of active components and if possible only a single amplifier.

According to the present invention there is provided a phase detector for mark/space-modulated signals, the phase detector comprising a pulse amplitude modulator and an integrator disposed on the output side of the modulator. The pulse amplitude modulator comprises a switch the control input of which is fed by pulses which are subjected to mark/space modulation by means of a phase-shifted signal, the pulse amplitude modulator having an amplitude input which is fed by a non-phase-shifted signal. The integrator includes an integrating amplifier the output of which is connected by means of a capacitor to an inverting input of the integrating amplifier.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
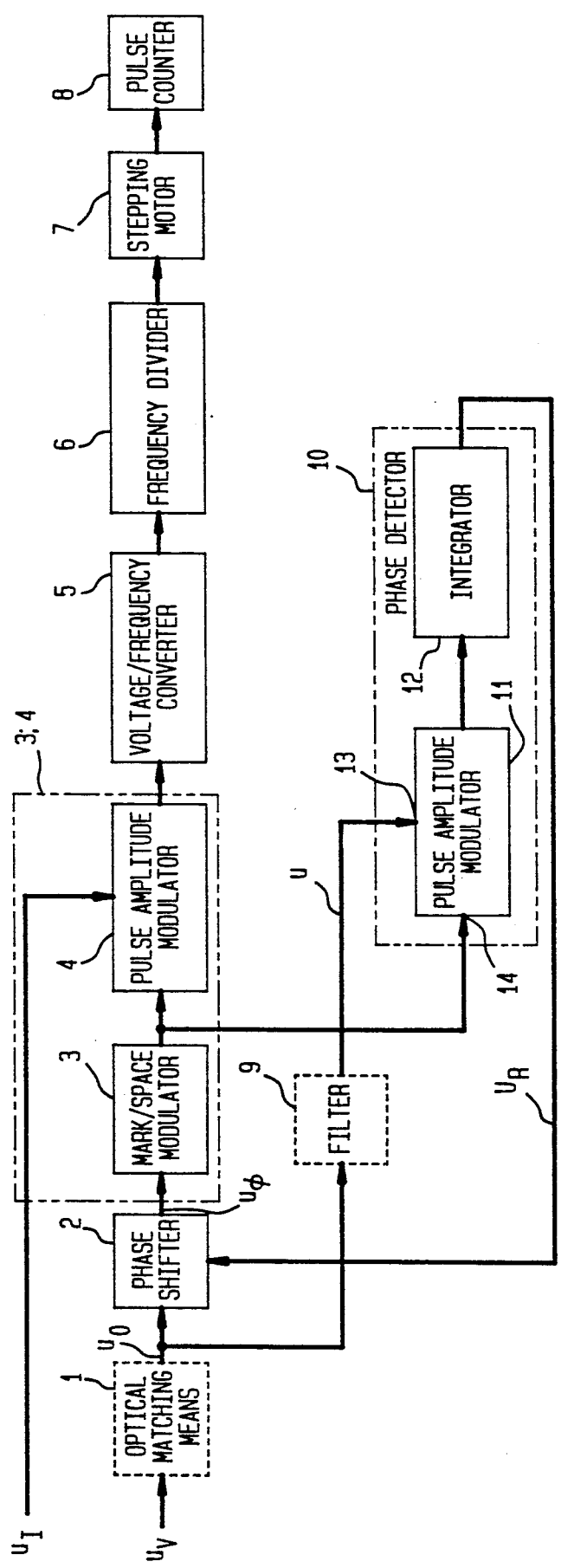
FIG. 1 shows a block circuit diagram of an electricity meter for reactive energy.

An electricity meter for reactive energy, as shown in FIG. 1, comprises an optical matching means 1, a phase shifter 2, a mark/space modulator 3, a pulse amplitude modulator 4, a voltage-frequency converter 5, a frequency divider 6, a stepping motor 7 with interface circuit and a pulse counting means 8, which are all connected in cascade relationship in the specified sequence. The arrangement also includes an optional filter 9 and a phase detector 10 embodying the invention, the phase detector 10 comprising a further pulse amplitude modulator 11 and an integrator 12 which is connected on the output side thereof in cascade relationship. A voltage $u_I$ (which is proportional to a current) feeds an amplitude input of the pulse amplitude modulator 4 while a voltage $u_V$ (which is proportional to a voltage associated with the current) feeds the input of the phase shifter 2 either directly or by way of the optional matching means 1. A signal $u_o$ which is not phase-shifted, which thereby occurs as an input signal at the input of the phase shifter 2, in turn also feeds an amplitude input 13 of the optional filter 9. The output of the mark/space modulator 3 is also connected to a pulse input 14 of the further pulse amplitude modulator 11 while the output of the integrator 12 is applied to a control input of the phase shifter 2.

The matching means 1, if provided, may for example be a known non-inverting amplifier, and is arranged to match the voltage $u_V$ in terms of level and/or impedance to the inputs of the circuits 2 and 9 or 2 and 11 disposed on the output side thereof. The phase shifter 2, the mark/space modulator 3 and the phase detector 10 form the above-mentioned 90° phase-lock loop, while the non-phase-shifted signal $u_o$ which occurs at its input and thus at the input of the phase shifter 2 is phase-shifted by a phase value $\phi$ in the phase shifter 2; the resulting phase-shifted signal $u_\phi$ then provides for mark/space modulation of the pulses produced in the mark/space modulator 3. The mark/space modulated pulses then feed respective pulse inputs of the two pulse amplitude modulators 4 and 11 and are evaluated on the one hand in the group formed by the circuits 4 to 8 to produce and display a reactive energy value as measured by the electricity meter and on the other hand in the phase detector 10 to produce a regulating voltage $U_R$ which in turn is fed back as a voltage proportional to the difference between the reference value and the actual value, to the control input of the phase shifter 2 where it regulates the phase value $\phi$ of the phase shift between the two signals $u_o$ and $u_\phi$ until in the stable condition the difference between the reference value and the actual value is approximately equal to zero. That is the case when the reference value is selected to be equal to zero when $\cos \phi = 0$ and thus $\phi = 90°$. In that situation the non-phase-shifted signal $u_o$ feeds the amplitude input 13 of the pulse amplitude modulator 11, after it has optionally been filtered by means of the filter 9 which eliminates any interference signals that are possibly present. The mark/space modulator 3 and respective ones of the two pulse amplitude modulators 4 and 11 together form a respective mark/space amplitude modulator 3, 4 and 3, 11, which respectively operate as a multiplier means insofar as the areas of their output pulses are proportional to the products $u_\phi \cdot u_I$ and $u_\phi \cdot u_o$ respectively of their input signals $u_\phi$ and $u_I$, and $u_\phi$ and $u_o$ respectively.

On the assumption that (i) the signals $u_V$ and $u_I$ are of cosine form, are each of an amplitude $U_V$ and $U_I$ and have a phase difference $\alpha$, and (ii) the matching means 1 and the filter 9 are either not provided or each have a gain factor of unity and no phase shift, that means that, with $\phi = 90°$, the areas of the output pulses of the pulse amplitude modulator 4 are proportional to $U_V \cdot U_I \cdot [\cos(\alpha + 90°) + \cos(2\Omega t + \alpha + 90°)]$ and those of the output pulses of the pulse amplitude modulator 11 are proportional to $U_V \cdot U_I [\cos \phi + \cos(2\Omega t + \phi)]$. The second terms are respectively eliminated by an integrator included in the voltage-frequency converter 5 and by an integrator 12 so that the output frequency of the voltage-frequency converter 5 is proportional to the reactive power $U_V \cdot U_I \cdot \sin \alpha$ and the regulating voltage $U_R$ at the output of the integrator 12 is proportional to $(U_V)^2 \cdot \cos \phi$, wherein in the steady-state condition of the phase-lock loop 2, 3, 10, the phase value $\phi$ is equal to 90°.

The output frequency of the voltage-frequency converter 5, which is proportional to the reactive power, is also divided in the frequency divider 6 and the output pulses of the latter are then counted by means of the stepping motor 7 and the pulse counting means 8, for the purposes of ascertaining the measured reactive energy.

Figure 3:
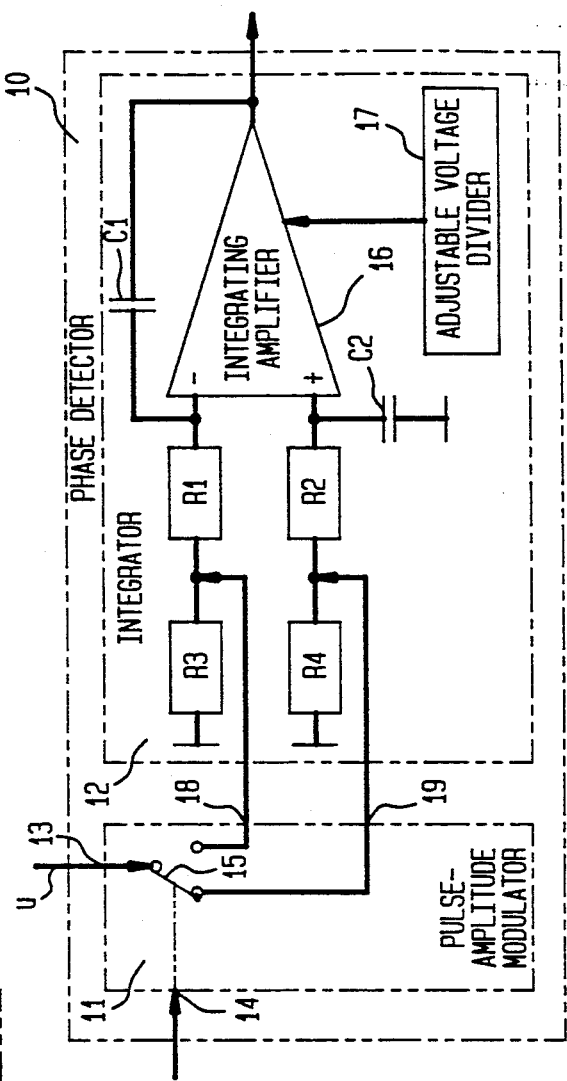
FIG. 3 is a circuit diagram of a first alternative form of a phase detector according to a first embodiment of the invention.
Figure 4:
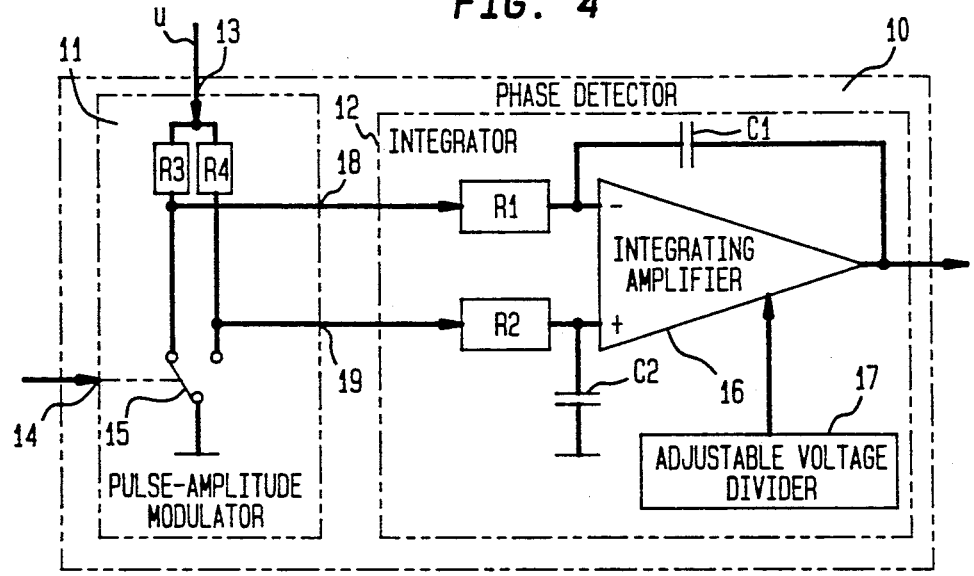
FIG. 4 is a circuit diagram of a second alternative form of a phase detector according to a second embodiment of the invention.

In a first alternative form, the phase detector 10 is of the structure shown in FIG. 3, while in a second alternative form, it is of the structure shown in FIG. 4. In third to fifth alternative forms of the phase detector 10, the integrator 12 is a Miller integrator and is then preferably of the configuration shown in FIG. 2.

In all alternative forms, the phase amplitude modulator 11 comprises a switch 15, the control input of which forms the pulse input 14 of the pulse amplitude modulator 11 and is fed by pulses which are subjected to mark/space modulation by means of the phase-shifted signal $u_\phi$. In all alternative forms, the integrator 12 includes an integrating amplifier 16, the output of which is connected by means of a capacitor C1 to an inverting input of the integrating amplifier 16 which is preferably an operational amplifier.

Figure 2:
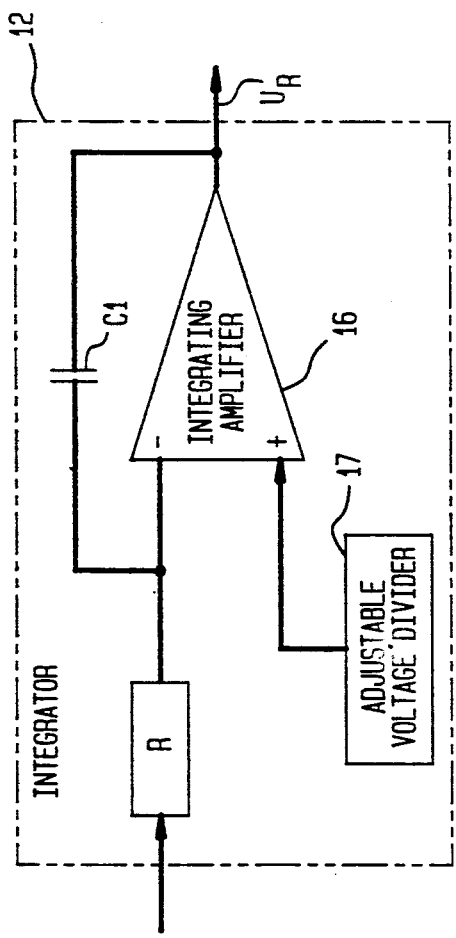
FIG. 2 is a circuit diagram of a Miller integrator which can be used in the meter of FIG. 1.

The Miller integrator shown in FIG. 2 includes the integrating amplifier 16 with the capacitor C1. Its inverting input is connected within the integrator 12 by way of an input resistor R to the input of the integrator 12 while a non-inverting input of the integrating amplifier 16 is connected to the output of an adjusting means 17 which may, for example, be an adjustable voltage divider with which it is possible to provide for zero adjustment of the integrating amplifier 16. The mode of operation of the Miller integrator is known and is therefore not described in greater detail herein.

The integrator 12 shown in FIG. 3 also includes the integrating amplifier 16 with the capacitor C1. In this arrangement, its non-inverting input is connected to ground by way of a further capacitor C2. The switch 15 of the pulse amplitude modulator 11 which is also shown in FIG. 3 is a single-pole change-over switch. The inverting and non-inverting inputs of the integrating amplifier 16 are connected by way of respective resistors R1 and R2 to two inputs of the integrator 12 which in turn are connected on the one hand to ground by way of respective resistors R3 and R4 and on the other hand are taken to respective output terminals 18 and 19 of the pulse amplitude modulator 11. The output terminals 18 and 19 are connected within the pulse amplitude modulator 11 by way of respective switch contacts of the change-over switch to the amplitude input 13 of the pulse amplitude modulator 11. In this arrangement, the output of the adjusting means 17 is connected to an adjusting input of the integrating amplifier 16.

The switch 15 is switched over at the rhythm of, or in synchronism with, the mark/space-modulated output pulses of the mark/space modualtor 3. In this way, those pulses are subjected to amplitude modulation by the non-phase-shifted signal $u_o$ at the amplitude input 13 of the pulse amplitude modulator 14, and, when the filter 9 is present, by the filtered non-phase-shifted signal $u$ respectively, where $u$ denotes the output signal of the filter 9. The mark/space amplitude-modulated output pulses of the pulse amplitude modulator 11 are supplied, by way of a two-pole connection, to the integrating amplifier 16 which is connected as a differential integrator and the output signal of which is thus proportional to the difference between two integration signals, of which one is the integration signal in respect of the pulses and the other is the integration signal in respect of the spaces. The difference between the two integration signals then corresponds to the mean value of the algebraic sum of the areas of all pulses and spaces and, as already mentioned, is proportional to the product $(u_V)^2 \cdot \cos \phi$. The RC-circuit formed by the resistor R1 and the capacitor C1 integrates the areas of the pulses and the RC-circuit formed by the resistor R2 and the capacitor C2 integrates the areas of the spaces while the integrating amplifier 16 provides the difference between the two integration values. The phase detector illustrated in FIG. 3 has the advantage that it requires only a single amplifier, namely the integrating amplifier 16, and therefore is only affected by a single offset voltage.

The integrator 12 shown in FIG. 4 again includes the integrating amplifier 16 with the capacitor C1. Its non-inverting input is again also connected to ground by way of the capacitor C2. The switch 15 of the pulse amplitude modulator which is also shown in FIG. 4 is again a single-pole change-over switch. The inverting and non-inverting inputs of the integrating amplifier 16 are connected by way of respective resistors R1 and R2 to respective ones of two output terminals 18 and 19 of the pulse amplitude modulator 11, which in turn are connected within the pulse amplitude modulator 11 by way of further respective resistors R3 and R4 to the amplitude input 13 of the pulse amplitude modulator 11 on the one hand and on the other hand are connected to ground by way of a respective switch contact of the change-over switch. The output of the adjusting means 17 is again connected to an adjusting input of the integrating amplifier 16.

The phase detector 10 shown in FIG. 4 operates in a similar manner to the phase detector 10 shown in FIG. 3, with the difference that the two resistors R3 and R4 are not contained in the integrator 12 but in the pulse amplitude modulator 11. The phase detector 10 once again requires only a single amplifier, namely the integrating amplifier 16, and accordingly once again there is only a single offset voltage.

Figure 5:
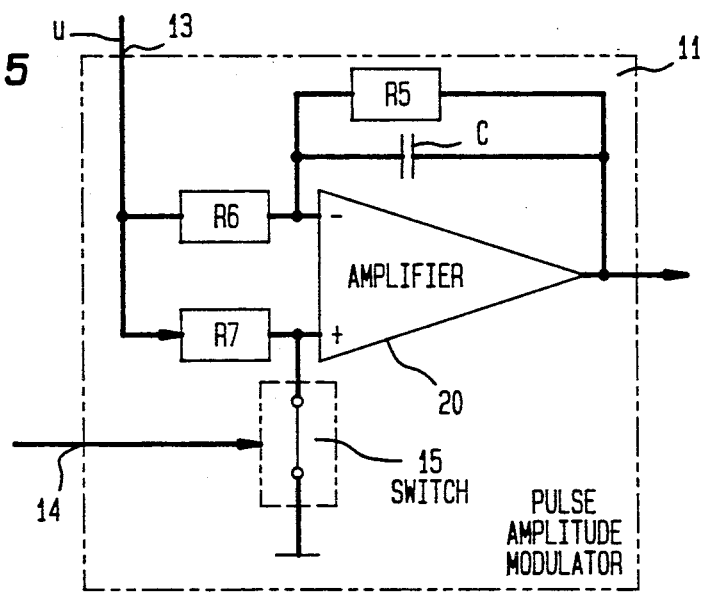
FIG. 5 is a circuit diagram of a first alternative form of a pulse amplitude modulator which can be used in the meter of FIG. 1.

The pulse amplitude modulator 11 shown in FIG. 5 includes an amplifier 20. An inverting input of the amplifier 20 is connected on the one hand at least by way of a feedback resistor R5 to an output of the amplifier 20 and on the other hand by way of a first input resistor R6 to the amplitude input 13 of the pulse amplitude modulator 11. In contrast, a non-inverting input of the amplifier 20 is connected on the one hand to ground by way of the switch 15 and on the other hand by way of a second input resistor R7 to the amplitude input 13 of the pulse amplitude modulator 11. The switch 15 is preferably an opening contact and a capacitor C may optionally be connected in parallel with the resistor R5.

The amplifier 20 connected as shown in FIG. 5 in the third alternative phase detector 10 operates as a known amplifier which may be formed by an operational amplifier and which preferably has a gain factor "1" in one position of the switch 15 and preferably a gain factor "−1" in the other position of the switch 15, so that the polarity of its output signal is inverted in synchronism with the mark/space-modulated output pulses of the mark/space modulator 3. Therefore, the amplitude-modulated pulses appear alternately inverted and non-inverted at the input of the Miller integrator 12 which is connected on the output side thereof and which thus alternately integrates the pulses and the spaces.

Figure 6:
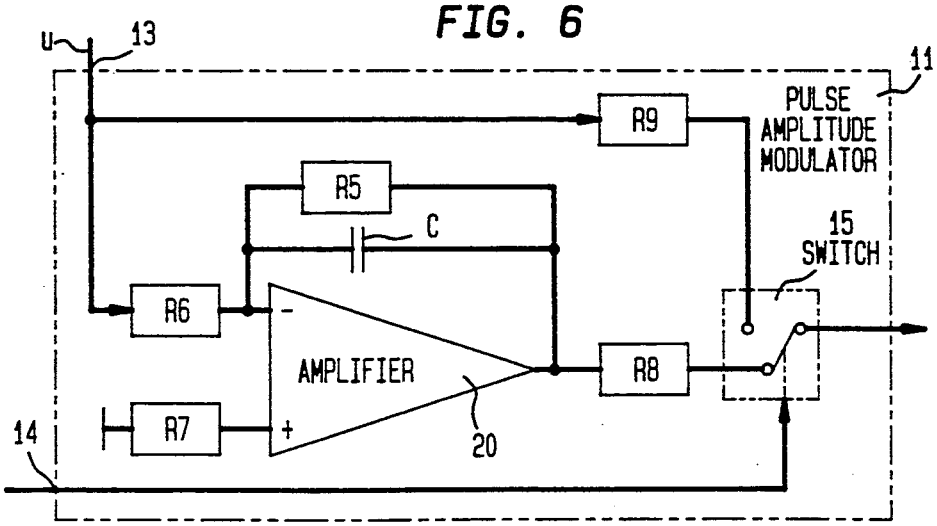
FIG. 6 is a circuit diagram of a second alternative form of the pulse amplitude modulator.

The pulse amplitude modulator 11 shown in FIG. 6 in the fourth alternative form of the phase detector 10 also includes the amplifier 20. An inverting input of the amplifier 20 is connected on the one hand at least by way of the feedback resistor R5 to an output of the amplifier 20 and on the other hand by way of the first input resistor R6 to the amplitude input 13 of the pulse amplitude modulator 11. A non-inverting input of the amplifier 20 is connected to ground by way of the second input resistor R7. The switch 15 is a single-pole change-over switch. The output of the pulse amplitude modulator 11 is connected in the specified sequence by way of respective contacts of the change-over switch 15 and respective further resistors R8 and R9 to the output of the amplifier 20 and to the amplitude input 13 of the pulse amplitude modulator 11.

In the pulse amplitude modulator 11 shown in FIG. 6, the amplifier 20 as connected operates as an inverting amplifier preferably with a gain factor "−1". The voltage $u_o$ or u which occurs at the amplitude input 13 of the pulse amplitude modulator 11 goes to the output of the pulse amplitude modulator 11 in synchronism with the mark/space-modulated output pulses of the mark/space modulator 3, on the one hand in a non-inverted condition, directly by way of the resistor R9, and on the other hand in an inverted condition by way of the amplifier 20 and the resistor R8, and thus reaches the input of the integrator 12 which is connected on the output side of the modulator 11 and which then operates in the same way as the integrator 12 in the third alternative form.

Figure 7:
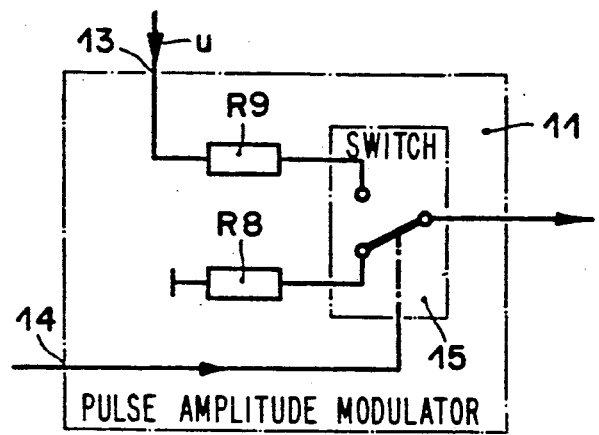
FIG. 7 is a circuit diagram of a third alternative form of the pulse amplitude modulator.

The pulse amplitude modulator 11 shown in FIG. 7 includes a single-pole change-over switch as the switch 15. The output of the pulse amplitude modulator 11 is connected in the specified sequence by way of respective contacts of the change-over switch and respective further resistors R8 and R9 respectively connected to ground and to the amplitude input 13 of the pulse amplitude modulator 11.

In the pulse amplitude modulator 11 shown in FIG. 7, the amplitude-modulated and mark/space-modulated pulses are passed by way of the resistor R9 to the output of the pulse amplitude modulator 11 and therewith to the input of the Miller integrator 12 which is connected on the output side thereof, while the spaces are suppressed by ground being presented by way of the resistor R8 to the output of the pulse amplitude modulator 11 and thus to the input of the Miller integrator 12. This fifth alternative form of the phase integrator 10 also has the advantage that only one amplifier, namely the integrating amplifier 16, is required and thus there is only a single offset voltage.

Figure 8:
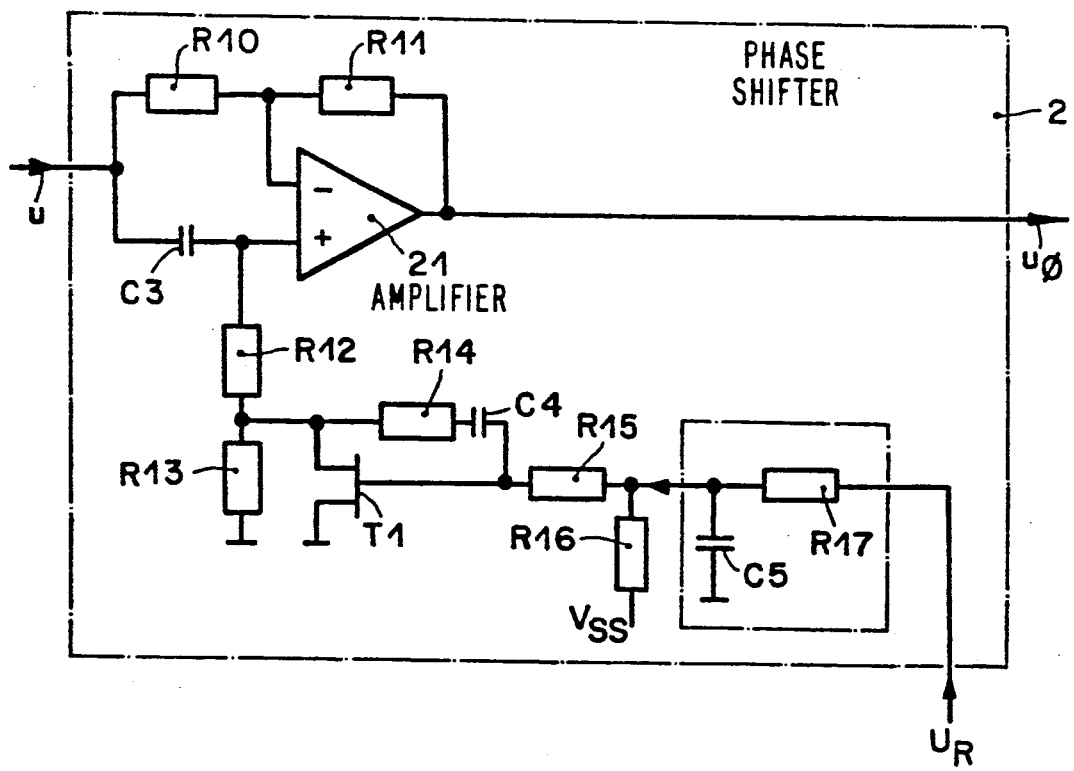
FIG. 8 is a circuit diagram of a phase shifter which can be used in the meter of FIG. 1.

The phase shifter shown in FIG. 8 comprises an operational amplifier 21, the inverting input of which is connected on the one hand by way of a resistor R10 to the input of the phase shifter 2 and on the other hand by way of a resistor R11 to an output of the operational amplifier 21 which is also the output of the phase shifter 2. The non-inverting input of the operational amplifier 21 is connected on the one hand by way of a capacitor C3 to the input of the phase shifter 2 and on the other hand by way of a resistor R12 to a common terminal of a resistor R13, a field effect transistor T1 and a series circuit R14; C4 consisting of a resistor R14 and a capacitor C4. The gate of the field effect transistor T1 is connected to a second terminal of the series circuit R14; C4 and by way of a resistor R15 to a common terminal of a resistor R16, a capacitor C5 and a resistor R17. The second terminal of the resistor R17 forms the control input of the phase shifter 2 to which the regulating voltage $U_R$ supplied by the output of the integrator 12 is applied while the second terminal of the resistor R13 and the capacitor C5 and the third terminal of the field effect transistor T1 go to ground. In contrast, the second terminal of the resistor R16 is supplied with a dc voltage $V_{SS}$ which is for example −5 volts and which serves to set the input voltage of the field effect transistor T1 to a voltage between 0 and −5 volts.

The phase shifter 2 shown in FIG. 8 includes an active first-order all-pass filter including the operational amplifier 21, the resistors R10, R11, the capacitor C3, the resistors R12, R13 and the field effect transistor T1, the phase of the filter being set to 90° by means of the field effect transistor T1 operating as an adjustable resistor, under the control of the regulating voltage $U_R$. The regulating voltage $U_R$ is previously also filtered by the RC circuit formed by a resistor R17 and a capacitor C5, and is matched in respect of level to the gate input of the field effect transistor T1 by means of the voltage $V_{SS}$ and the resistors R15 and R16.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

What is claimed is:

1. A phase-locked loop for use in an electricity meter comprising means for supplying a first non-phase-shifted signal, phase-shifting means for phase-shifting said first signal a predetermined angle to produce a second signal phase-shifted with respect to the first signal, a mark/space modulator for producing pulses which are subject to mark/space modulation in accordance with said second phase-shifted signal, and a phase detector comprising a pulse amplitude modulator and an integrator connected to an output of said pulse amplitude modulator, said pulse amplitude modulator comprising a switch having a control input for receiving said mark/space modulated pulses from said mark/space modulator and an amplitude input for receiving said first non-phase-shifted signal, and an output, said integrator being directly connected to the output of said pulse amplitude modulator and generating an output signal which is transmitted to said phase-shifting means for controlling the phase-shift between said first and second signals so that said phase-shift is maintained at said predetermined angle.

2. The phase-locked loop of claim 1 wherein said pulse amplitude modulator comprises a switch having first and second contacts, said integrator comprises first and second inputs and an integrating amplifier having a non-inverting input which is connected to ground via a capacitor and an inverting input, said inverting and non-inverting inputs of said integrating amplifier being connected by first and second resistors to said first and second inputs of said integrator, respectively, said first and second inputs of said integrator being connected to ground via third and fourth resistors, respectively, and to the amplitude input of the pulse amplitude modulator via said first and second contacts of said switch, respectively.

3. The phase-locked loop of claim 1 wherein said phase-locked loop includes a filter for eliminating interference signals in said non-phase-shifted signal.

4. The phase-locked loop of claim 1 wherein said integrator comprises an integrating amplifier having an inverting input and an output connected to the inverting input via a capacitor.

5. The phase-locked loop of claim 1 wherein said pulse amplitude modulator comprises a switch having first and second contacts, and first and second resistors for connecting said first and second contacts to said amplitude input, respectively, and said integrator comprises first and second inputs and an integrating amplifier having a non-inverting input which is connected to ground via a first capacitor, an inverting input, and an output which is connected via a second capacitor to said inverting input, said inverting and non-inverting inputs of said integrating amplifier being connected by way of third and fourth resistors to said first and second inputs of said integrator, said first and second inputs of said integrator being electrically connected to said first and second contacts and said first and second resistors, respectively.

6. The phase-locked loop of claim 1 wherein said integrator comprises an input and an integrating amplifier, said integrating amplifier comprising an inverting input connected to said input via an input resistor and an output connected to said inverting input via a feedback capacitor.

7. The phase-locked loop of claim 1 wherein said pulse amplitude modulator comprises an amplifier having an inverting input connected to said amplitude input by way of a first input resistor, an output connected to the inverting input by way of a feedback resistor, and a non-inverting input connected to ground by way of said switch and to said amplitude input by way of a second input resistor, wherein said output of said amplifier forms said output of said pulse amplitude modulator.

8. The phase-locked loop of claim 1 wherein the non-phase shifted signal is transmitted to said switch in non-inverted form via a resistor and transmitted to said switch in inverted form via an inverting amplifier synchronously with the pulses produced by said mark/space modulator.

* * * * *